United States Patent
Rothaar et al.

(10) Patent No.: US 7,263,143 B1
(45) Date of Patent: Aug. 28, 2007

(54) SYSTEM AND METHOD FOR STATISTICALLY DIRECTING AUTOMATIC GAIN CONTROL

(75) Inventors: Bruce C. Rothaar, Woodinville, WA (US); Jerry Prismantas, Federal Way, WA (US); Randy J. Karr, Maple Valley, WA (US); Jean-Francois Grenon, Seattle, WA (US); Heinz Lycklama a'Nyeholt, Arlington, WA (US)

(73) Assignee: Adaptix, Inc., Bellevue, WA (US)

( * ) Notice: Subject to any disclaimer, the term of this patent is extended or adjusted under 35 U.S.C. 154(b) by 1179 days.

(21) Appl. No.: 09/851,408

(22) Filed: May 7, 2001

(51) Int. Cl.
- H04L 27/08 (2006.01)
- H03D 1/04 (2006.01)
- H04B 1/06 (2006.01)

(52) U.S. Cl. .................. 375/345; 375/346; 455/245.1; 455/250.1

(58) Field of Classification Search ................ 375/136, 375/343, 345, 346; 455/63.3, 266, 272, 219, 455/240.1, 245.1, 250.1; 714/795
See application file for complete search history.

(56) References Cited

U.S. PATENT DOCUMENTS

| | | | | |
|---|---|---|---|---|
| 3,374,435 A | * | 3/1968 | Engel | 375/349 |
| 4,457,007 A | * | 6/1984 | Gutleber | 375/349 |
| 5,029,182 A | * | 7/1991 | Cai et al. | 375/136 |
| 5,113,400 A | * | 5/1992 | Gould et al. | 714/795 |
| 5,142,695 A | * | 8/1992 | Roberts et al. | 455/437 |
| 5,208,837 A | * | 5/1993 | Richey | 375/350 |
| 5,214,675 A | * | 5/1993 | Mueller et al. | 375/340 |
| 5,267,310 A | * | 11/1993 | Yoshiba | 379/416 |
| 5,379,324 A | * | 1/1995 | Mueller et al. | 375/340 |
| 5,420,889 A | * | 5/1995 | Juntti | 375/346 |
| 5,425,000 A | * | 6/1995 | Reed et al. | 367/131 |
| 5,442,648 A | * | 8/1995 | DuBose et al. | 372/38.08 |
| 5,668,828 A | * | 9/1997 | Sanderford et al. | 375/136 |
| 5,721,756 A | * | 2/1998 | Liebetreu et al. | 375/344 |
| 5,732,341 A | * | 3/1998 | Wheatley, III | 455/234.1 |
| 5,745,531 A | * | 4/1998 | Sawahashi et al. | 375/345 |
| 5,758,271 A | * | 5/1998 | Rich et al. | 455/234.1 |
| 5,929,811 A | * | 7/1999 | Rilling | 342/380 |
| 5,966,684 A | * | 10/1999 | Richardson et al. | 702/191 |
| 6,009,129 A | * | 12/1999 | Kenney et al. | 375/346 |
| 6,072,998 A | * | 6/2000 | Kaku | 455/234.2 |
| 6,081,564 A | * | 6/2000 | Han | 375/345 |
| 6,154,503 A | * | 11/2000 | Strolle | 375/264 |
| 6,175,270 B1 | * | 1/2001 | Vannucci | 330/2 |
| 6,212,244 B1 | * | 4/2001 | Davidovici et al. | 375/345 |
| 6,229,797 B1 | * | 5/2001 | Cho | 370/342 |

(Continued)

*Primary Examiner*—Mohammed Ghayour
*Assistant Examiner*—Lawrence Williams
(74) *Attorney, Agent, or Firm*—Fulbright & Jaworski LLP

(57) ABSTRACT

The present invention is directed to a system and method which statistically determines when regularly occurring interference events of a predictable duration will occur, for example radar pulses and dynamically adjusts an automatic gain control (AGC) for RF data transmissions accordingly. The repetition rate and width of radar pulses are regular. By averaging and watching for correlations, the present AGC identifies the pulse rate and pulse widths and over a fairly short period of time predicts when the next pulse is coming. When the next pulse occurs, the AGC is adjusted to react accordingly. The AGC can raise or lower gain levels for the duration of the pulse; or ignore the pulse, if it is of a very short duration, so that the AGC level will coast through the event.

30 Claims, 2 Drawing Sheets

U.S. PATENT DOCUMENTS

| | | | |
|---|---|---|---|
| 6,256,477 B1 * | 7/2001 | Eidson et al. | 455/63.3 |
| 6,377,607 B1 * | 4/2002 | Ling et al. | 375/130 |
| 6,408,696 B1 * | 6/2002 | Jong | 73/579 |
| 6,442,130 B1 * | 8/2002 | Jones et al. | 370/208 |
| 6,459,727 B1 * | 10/2002 | Cho et al. | 375/222 |
| 6,463,261 B1 * | 10/2002 | Hiramatsu et al. | 455/63.1 |
| 6,498,819 B1 * | 12/2002 | Martin | 375/345 |
| 6,510,312 B1 * | 1/2003 | Lempiainen | 455/101 |
| 6,539,213 B1 * | 3/2003 | Richards et al. | 455/226.3 |
| 6,571,089 B1 * | 5/2003 | Richards et al. | 455/266 |
| 6,603,825 B1 * | 8/2003 | Pecen | 375/345 |
| 6,690,915 B1 * | 2/2004 | Ito et al. | 455/7 |
| 6,768,727 B1 * | 7/2004 | Sourour et al. | 370/335 |
| 6,775,336 B1 * | 8/2004 | Takaki | 375/345 |
| 6,804,501 B1 * | 10/2004 | Bradley et al. | 455/138 |
| 6,807,405 B1 * | 10/2004 | Jagger et al. | 455/296 |
| 6,823,022 B1 * | 11/2004 | Fullerton et al. | 375/285 |
| 2001/0048727 A1 * | 12/2001 | Schmutz et al. | 375/345 |
| 2002/0142725 A1 * | 10/2002 | Clelland et al. | 455/63 |
| 2002/0155811 A1 * | 10/2002 | Prismantas et al. | 455/63 |
| 2003/0194979 A1 * | 10/2003 | Richards et al. | 455/216 |
| 2003/0232608 A1 * | 12/2003 | Yamauchi | 455/136 |
| 2005/0113046 A1 * | 5/2005 | Liu | 455/135 |

* cited by examiner

SYSTEM AND METHOD FOR STATISTICALLY DIRECTING AUTOMATIC GAIN CONTROL

TECHNICAL FIELD OF THE INVENTION

The present invention relates to communications interference detection and mitigation systems and more particularly to a system and method for directing automatic gain control for RF data transmissions in response to tabulated interference statistics.

BACKGROUND OF THE INVENTION

Automatic Gain Control (AGC) is used in virtually all radio receivers, and serves several functions. Primarily AGC is necessary to keep signal levels within a range so that a system's amplifiers are not overloaded. AGC serves to maintain proper tracking loop gain for servos and maintain levels that are appropriate for demodulation. Many modulation formats, such as 64QAM and 16QAM, need to adjust the signal level fairly accurately in order for the demodulator to deliver a usable data stream.

Prior art AGC has been limited because it has been implemented with an analog servo loop or feedback loop. For example, a signal may arrive at the demodulator and feed back to the input stages to adjust the gains of the input stages. This prior art system is undesirable because if an impulse comes through the system, a radar pulse for example, it is too late for the AGC to act upon the impulse. The high power signal has already clipped the data transmission as it goes through the amplifiers before the AGC can ever see it to try to turn down the gain. As a result there is damage to the wave form, and thousands of bits of data are destroyed before the AGC can get around to setting a new level that would accommodate the radar pulse.

Currently, there are several so-called "last mile" and "last foot" data transmission systems which are designed to deliver high speed and/or high data capacity from one location to another. Several such systems use RF transmission to replace copper wire or coaxial cable. Some of these systems are called point to point or point to multipoint systems and operate in the 28-38 GHz bands. A fundamental characteristic of such existing systems is that their RF transmissions occur in a frequency spectrum protected and regulated by a government body. These protected frequency spectrums, or bands, are licensed to certain license holders and only one (or a selected few) may operate in any given physical area. In such situations, rigorous rules apply to anyone holding permits for the usage of those protected bands. Another fundamental characteristic of such protected bands is that all users are licensed to perform the same type of RF transmission.

When operating in a licensed band the interference between transmissions is not only homogeneous, i.e., wideband, it originates from the same type of antenna to accomplish the same type of transmission and is thus controllable. Accordingly, noise (interference from another transmitter on the same frequency or on an interfering frequency) typically will be evenly spread.

In a typical licensed application, the frequency coordination would mathematically predict a certain low level of interference. If a system could not achieve a low level of interference, a license would not be granted for most systems. Once the governing body grants the license, all those holding licenses to the same band are afforded protection. Thus, in a protected band, if a narrow band interferer is detected, the licensed user could call the FCC (or other policing agency) and ask that the agency investigate and rectify the problem. In an unlicensed band, the user is essentially on his/her own and usually no such official remedy is available.

Because of the licensed nature of such RF bands, only a limited number of companies may provide service within those bands. Thus, in order to widen the choices consumers have, it is desirable for service providers to be able to use unlicensed RF bands to provide high data rate capability to deliver high speed, high capacity data services.

In 1997 the FCC created a wireless arena called Unlicensed National Information Infrastructure (U-NII). System operators are free to operate wireless equipment in three sub-bands (5.15 to 5.25 GHz, 5.25 to 5.35 GHz and 5.725 to 5.825 GHz) without acquiring a licensed frequency spectrum. Part 15 of the FCC document specifies the conditions for operating wireless equipment in the U-NII frequency band. However, operators are not protected from possible interference from other U-NII operators transmitting in the vicinity or even other systems which utilize the same frequencies.

The IEEE, a standards group, is defining a wireless LAN standard, referred to as IEEE 802.11a for operation in the U-NII band. Equipment that conforms to this standard will operate indoors at the lower frequency sub-band i.e. 5.15 to 5.25 GHz. The ETSI BRAN group in Europe has defined an air interface standard for high-speed wireless LAN equipment that may operate in the U-NII frequency band. Equipment that is compatible with this standard may cause interference with use of these unlicensed bands.

One major problem with the use of such unlicensed bands is that it is very difficult, if not impossible, to control RF interference from other users of the unlicensed band. These other users may be using the selected unlicensed band for uses which are essentially different from that employed to deliver communication services. For example, the 5.25 to 5.35 GHz and 5.725 to 5.825 GHz bands are available for use for outdoor data communication between two points. This is typically a wideband use. The same bands are also available for use by radar. When the same band is used for point to point communication, and also used by others such as radar, data communications between sending and receiving antennas will experience significant interference from radar pulses, which are broadcast over a wide area in small (narrow) repetitive bursts.

In the current state of the art, there is no discrimination between continuous or repetitive interference. When interference is detected, it is usually based on a signal to noise ratio for any given channel, then the radio switches to a lower level modulation, from either 64QAM to 16QAM, or 16QAM to QPSK, or QPSK to BPSK. For orthogonal frequency division multiplexing (OFDM), the modulation order of the subcarriers is reduced. Lower modulation shifting allows more tolerance for noise and interference.

Prior art radar interference mitigation is intended for use in currently licensed RF bands. However, radar interference is not an issue of great concern in licensed bands because there is little or no such interference. Most licensed bands are free and clear of other harmful interferers. Additionally, most unlicensed bands do not have strong radar interferers. However, there is other low level interference in the unlicensed RF bands. This interference is at a much lower level and has a different signature than high powered radar. Therefore, generally speaking, prior art interference mitigation systems do not detect radar interference nor do they attempt to avoid it.

As described above, prior art AGC is analog. It basically has feedback loops so it monitors what it receives, but by the time it responds to dampen a signal, data is lost. The prior art AGC is not sufficient for use with RF data transmission in relatively noisy unlicensed bands. A large amount of in-band interference, and potentially high power interference, such as radar pulses are present in unlicensed RF bands which is very disruptive to high speed data transmissions in those bands.

In an unlicensed RF band data transmission environment it is difficult to determine a proper AGC bandwidth. If the AGC bandwidth is too low, response is very slow. The AGC will miss fast rising events. If the AGC bandwidth is too high then it will track things that happen quickly. However, the AGC may overcompensate, lowering gain levels too quickly or to too low of a level, resulting in lost data. Still, the AGC must respond quickly enough that, when there is a legitimate fade of the signal due to interference, it will track the interference event.

Prior art AGC will not allow both high gain and low gain settings at the same time. An AGC circuit that has a very fast response time will, when it is exposed to a radar pulse, tend to ramp very quickly to a new higher or lower level in order to accommodate the radar pulse. Ramping very quickly will either raise the gain to an unacceptable level or lower the gain disrupting the transmission rate, which results in a signal which cannot be properly modulated/demodulated. Ideally to accommodate a radar pulse, it is desirable to identify it as a radar pulse and be able to predict its occurrence and its duration.

SUMMARY OF THE INVENTION

The present invention is directed to a system and method which provides a solution that statistically determines when regularly occurring interference events of a predictable duration will occur and directs an AGC circuit to respond accordingly. The repetition rate and width of predictable interference, such as radar pulses, are by definition very regular. By averaging and watching for correlations, a statistically guided AGC will be able to identify the pulse rate and pulse widths and be able to predict over a fairly short period of time when the next interference pulse is coming. When the next pulse comes, the AGC can be adjusted just ahead of the pulse to react accordingly. The AGC can adjust gain levels for the duration of the pulse, or ignore the pulse. If a pulse is anticipated to be of a very short duration, the AGC can be directed to ignore the pulse so that the AGC level will coast through the event only losing data for the duration of the pulse.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION

Figure 1:
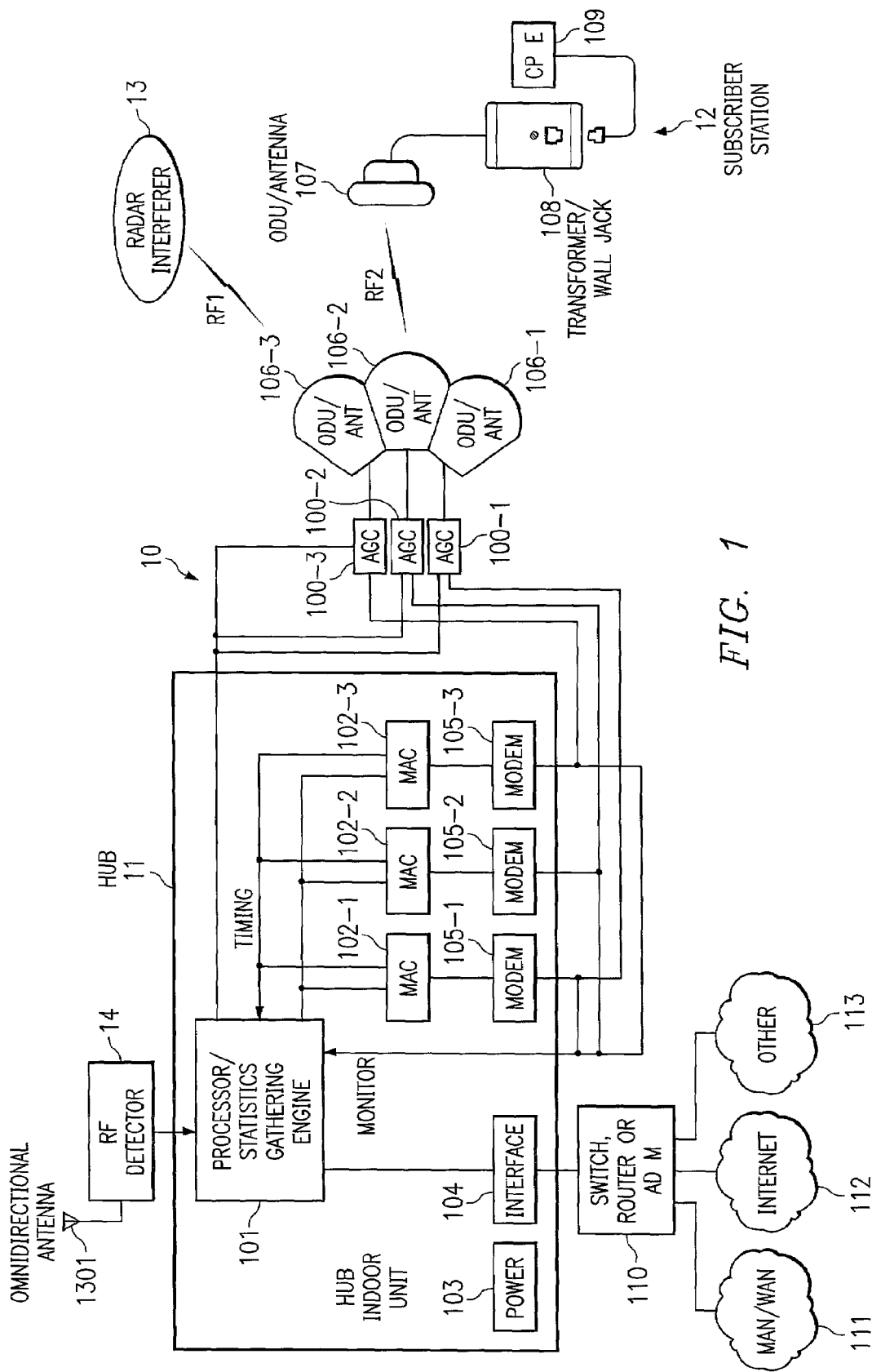
FIG. 1 is a diagram of an RF data transmission system employing the system and method for statistically directing automatic gain control of the present invention.

The present invention is used to detect interference and mitigate its effect on data transmission in unlicensed RF bands employing a method and system for a statistically directed automatic gain control 100 (AGC). Turning to FIG. 1, data transmission system 10 has hub 11 (which could be one of many) and subscriber station (SS) 12, again one of many. Hub 11 would be connected in a typical installation to other remotely located subscribers or users (not shown) via one or more networks, such as MAN/WAN 111, Internet 112, or any other network, such as network 113, all via switch router and/or add drop multiplexer ADM 110 and interface 104. These networks could be internal to an enterprise or could be connected to public or private networks either directly or via an intermediary network. Power for the hub 11 is provided via power supply 103.

Hub 11 serves to direct communications between subscriber station 12 and other users over RF link RF2 between one or more hub antennas 106 and subscriber antenna 107. Transmission between these antennas can use one or more modulations, such as for example, OFDM, 64QAM, 16QAM, QPSK or BPSK. At subscriber station 12, transmission to/from customer premises equipment (CPE) 109 flows, by way of example, via wall jack 108. A repetitive interferer such as radar antenna 13, sending out repetitive RF signals RF1 impinging on antenna 106-2, causes interference with transmission between hub 11 and subscriber station 12.

An omnidirectional antenna 1301 is connected to an RF detector 14. RF detector 14 provides strength of signal and RF information associated with a radar pulse to processor 101 for radar interference source 13. Processor 101 determines and tabulates duration and timing information for the interference. Preferably the omnidirectional antenna and RF detector data can be supplemented with directional information from hub antennas 106-1, 106-2 and 106-3, which are sectorized.

Subscriber unit antenna 107 can also detect radar interferers. The subscriber antenna is a much more directional antenna and it is not generally set up as high above the ground as the hub Antennas, so there is much less chance for interference on the subscriber unit. However, the subscriber unit can perform the same type of RF detection and responses for data transmissions as the hub to avoid interference.

Figure 2:
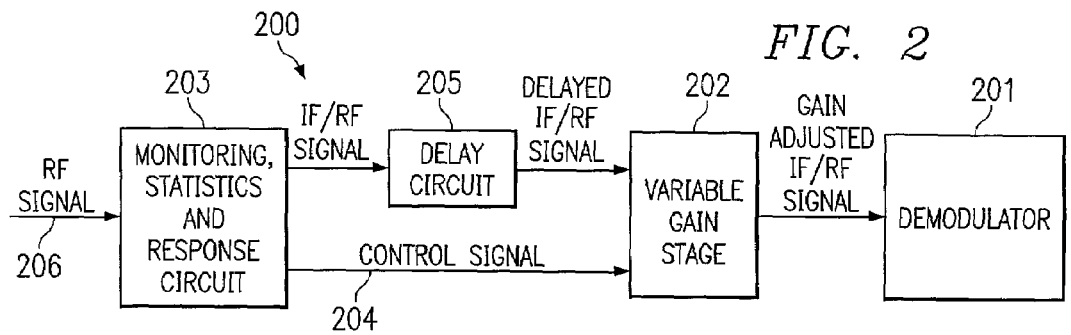
FIG. 2 is a logic branch diagram showing operation of the present statistically directed automatic gain control circuit.

With attention directed to FIG. 2, present statistically directed AGC 200 is a preprocessor to demodulator 201 which is part of a radio receiver. Statistically directed AGC 200 includes variable gain stage 202 which a signal passes through, and monitoring, statistic and response circuit 203 which generates control signal 204 for gain stage 202. The RF/IF signal which goes into the gain stage is delayed at delay circuit 205 to allow enough time for AGC 200 to assess the statistics of the signal and apply the appropriate gain. The AGC circuit constantly monitors the statistics of incoming data signal 206 and looks for repeatable situations. The repeatable situation could be a time-domain event, such as a string of spaced impulses, caused by for example a nearby electric motor, or a repeating frequency selective fade. The AGC circuit stores all such information in tables, and uses this information to predict future events. This allows gain stage 202 to be adjusted in unison with the events. All RF and IF signals, as well as the associated circuitry of the AGC, can be analog or the digital equivalents.

Figure 3:
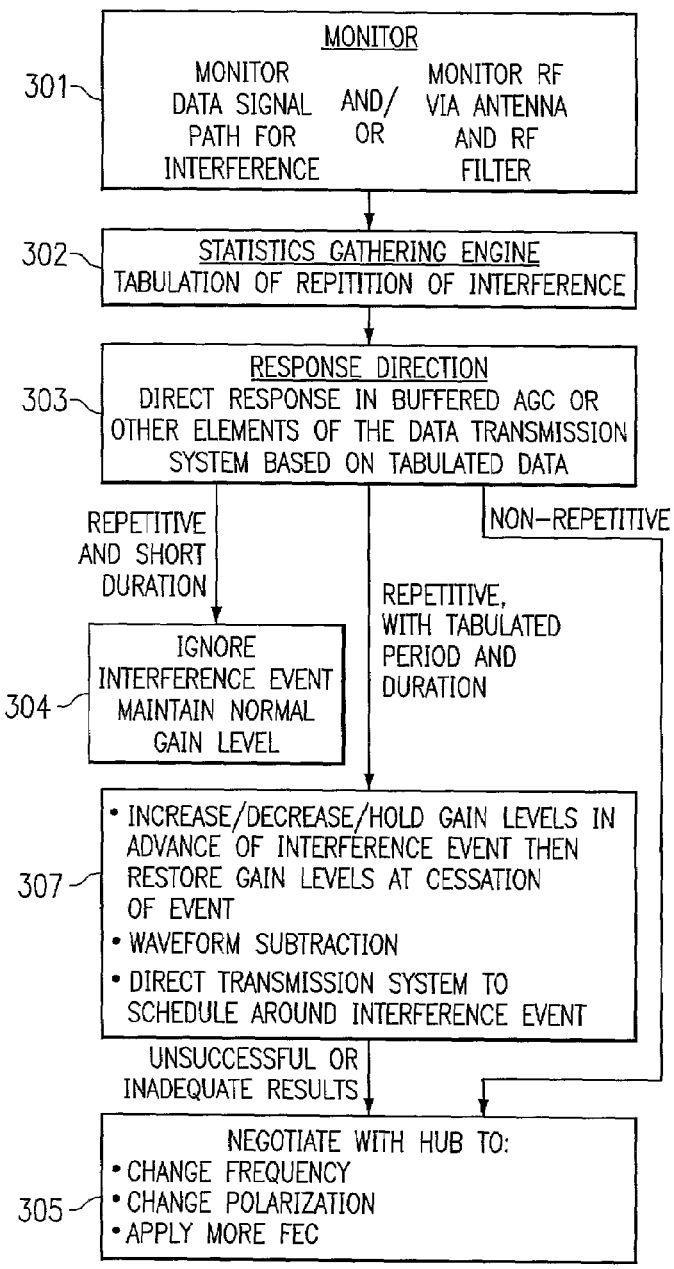
FIG. 3 is a logic branch diagram showing typical operation of the present statistically directed automatic gain control.

Turning to FIG. 3, a logic branch diagram of operation of the present statistically directed AGC 300 is shown. Monitoring system 301 preferably operates in two ways. The statistics for interference events can be derived from the same signal path as customer data, or can be derived through a separate path, such as through a dedicated antenna with a large field of view (1301 of FIG. 1) used to receive radar signals and any other interference signatures in the area. If the statistics are gathered from the same antenna and electronics as the data signal, it is difficult to get a broad view of the propagation of interference pulses since there is a data stream on top of the interference in the data signal. Signals from the antenna or data about interference from the data stream are fed to statistics gathering engine, box 302.

The statistics gathering engine looks for repetition in the interference at box 302. In other words, the statistics gathering engine seeks predictable factors in the signal such as an event that happens frequently such as every millisecond, or a signal occupying a certain band of frequencies once in a while. The statistics gathering engine creates a table of all of the different activity that has repetitive properties of sufficient length, a list of anomalies. Using the table, response system 303 can predict when the next anomaly is going to occur.

The response direction system controls the AGC and other signal processing elements, box 303. When an anomaly occurs, the response system directs one of many possible actions for the AGC, for example in response to repetitive interference event of short duration the AGC may be directed to ignore an event and hold gain levels for the duration of the event, box 304. For a repetitive event with a tabulated period and duration, the response system may direct the AGC to adjust gain levels to compensate for the event, then to return gain levels to normal at cessation of the event.

The response system may also include a general processing stage which can do subtraction, equalization, noise filtering, etc. The information in the tables is used to configure the processor at the correct time to undo a large variety of predictable distortions as indicated in box 307. For example, a subtraction process which subtracts out a waveform which is found by the statistics gathering engine to be very repetitive. For example, the buzz from a 60 Hz motor is a very repeatable wave form for which repetitive subtraction is practical. Also, equalization can be used where a certain type of multipath event occurs at a repetitive rate, by invoking equalization for the duration of the multipath interference event.

Part of the present statistically guided AGC is the ability to discern what is the proper response. In some cases the proper response is to use the AGC, box 307 or to hold the AGC still for a duration of an event, box 304. If the response at box 307 proves ineffective or if an interference event is non-repetitive, responses such as indicated in box 305 can be undertaken. For example the correct response for the data transmission system may be to avoid the interference by changing to a different frequency or antenna polarization. Another possibility is that forward error correction (FEC) should be increased on a link for the duration of an event. That would require the receiver making communications with the transmitter to forewarn it that the increased FEC needs to occur. The present invention has the ability to decide which response is most appropriate based on the statistics of the interference events.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An automatic gain control system comprising:
   means for tabulating statistical information about periodicity and duration of RF interference; and
   means operable, at least in part, to certain tabulated statistics for directing receiver gain of said gain control system.

2. The automatic gain control system of claim 1 wherein said means for tabulating also tabulates statistical information about the strength of said RF interference.

3. The automatic gain control system of claim 1 wherein said means for tabulating comprises means for detecting said interference.

4. The automatic gain control system of claim 3 wherein said means for detecting comprises an antenna.

5. The automatic gain control system of claim 3 wherein said means for detecting comprises means for monitoring an RF data stream for said interference.

6. The automatic gain control system of claim 1 wherein said means for directing includes means for selecting at least one action from a group of actions to reduce effects of said interference, said group of actions consisting of:
   maintaining gain levels, ignoring said interference;
   raising gain level prior to onset of said interference;
   lowering gain level prior to onset of said interference;
   raising gain levels at cessation of said interference; and
   lowering gain levels at cessation of said interference.

7. The automatic gain control system of claim 6 further comprising means operable, at least in part, to certain tabulated statistics for scheduling transmissions to avoid said interference.

8. The automatic gain control system of claim 6 further comprising means operable, at least in part, to certain tabulated statistics for changing an RF frequency of transmissions.

9. The automatic gain control system of claim 6 further comprising means operable, at least in part, to certain tabulated statistics for changing antenna polarity of RF transmissions.

10. The automatic gain control system of claim 6 further comprising means operable, at least in part, to certain tabulated statistics for performing waveform subtraction of said interference.

11. The automatic gain control system of claim 6 further comprising means operable, at least in part, to certain tabulated statistics for equalizing multipath events of an RF transmission.

12. The automatic gain control system of claim 6 further comprising means operable, at least in part, to certain tabulated statistics for increasing forward error correction of a transmission.

13. A method for operating a gain control circuit, said method comprising the steps of:
    gathering statistical information about periodicity and duration of RF interference; and
    directing receiver gain of said gain control circuit under at least partial control of said gathered statistical information to mitigate effects of said interference.

14. The method of claim 13 wherein said gathering includes gathering statistical information about the strength of said RF interference.

15. The method of claim 13 wherein said gathering step includes the step of detecting said interference.

16. The method of claim 15 wherein said detecting step includes receiving said interference on an antenna.

17. The method of claim 15 wherein said detecting step includes monitoring an RF data stream for said interference.

18. The method of claim 13 wherein said directing step further includes at least one step from a group of steps consisting of:
    directing said gain to hold gain levels, ignoring said interference;
    directing said gain to raise gain level prior to onset of said interference;
    directing said gain to lower gain level prior to onset of said interference;
    directing said gain to raise gain levels at cessation of said interference; and
    directing said gain to lower gain levels at cessation of said interference.

19. The method of claim 13 wherein said directing step further includes at least one step from a group of steps consisting of:
    directing said gain to hold gain levels, ignoring said interference;
    directing said gain to raise gain level prior to onset of said interference;
    directing said gain to lower gain level prior to onset of said interference;
    directing said gain to raise gain levels at cessation of said interference;
    directing said gain to lower gain levels at cessation of said interference;
    scheduling RF transmissions to avoid said interference;
    changing an RF frequency of transmissions;
    changing antenna polarity of RF transmissions;
    performing waveform subtraction of said interference;
    equalizing multipath events of an RF transmission; and
    increasing forward error correction of a transmission.

20. A circuit for an RF data transmission system, said circuit comprising:
    a digital delay stage delaying incoming RF data signals and outputting delayed IF signals;
    a variable gain stage receiving said delayed IF signals and outputting gain adjusted IF signals to a demodulator for said system;
    means for monitoring RF interference;
    means for gathering statistical information about periodicity and duration of said RF interference; and
    means for controlling said variable gain stage in response to said gathered statistical information to adjust gain of said delayed IF signals mitigating effects of said RF interference on said signals.

21. The circuit of claim 20 wherein said means for gathering also gathers statistical information about the strength of said RF interference.

22. The circuit of claim 20 wherein said means for monitoring comprises an antenna.

23. The circuit of claim 22 wherein said means for monitoring comprises means for analyzing said RF data signals for said interference.

24. The circuit of claim 21 wherein said means for controlling selects at least one action for said variable gain control stage in response to said statistical information from of a group of actions to reduce interference, said group of actions consisting of:
    directing said gain stage to hold gain levels, ignoring said interference;
    directing said gain stage to adjust gain levels in response to gain of said signals;
    directing said gain stage to raise gain level prior to onset of said interference;
    directing said gain stage to lower gain level prior to onset of said interference;
    directing said gain stage to raise gain levels at cessation of said interference; and
    directing said gain stage to lower gain levels at cessation of said interference.

25. The circuit of claim 20 further comprising means for responding to said gathered statistical information by directing said system to select from a group of actions to mitigate effects of said interference, said group of actions consisting of:
    scheduling transmissions to avoid said interference;
    changing an RF frequency of transmissions;
    changing antenna polarity of RF transmissions;
    performing waveform subtraction of said interference;
    equalizing multipath events of an RF transmission; and
    increasing forward error correction of a transmission.

26. A circuit for an RF data transmission system, said circuit comprising:
    a digital delay stage delaying incoming RF data signals and outputting delayed IF signals;
    a variable gain stage receiving said delayed IF signals and outputting gain adjusted IF signals to a demodulator for said system;
    a statistics gathering engine collecting periodicity, duration and strength information about RF interference; and a response stage adjusting said variable gain stage in response to said periodicity and duration information to mitigate effects of said RF interference on said signals.

27. The circuit of claim 26 wherein said statistics gathering engine analyzes said incoming RF data signals for said interference.

28. The circuit of claim 26 further comprising an antenna in electrical communication with said statistics gathering engine, said antenna monitoring said RF interference.

29. The circuit of claim 26 wherein said response stage selects at least one action for said variable gain control stage in response to said periodicity and duration information from of a group of actions to mitigate interference, said group of actions consisting of:
   directing said gain stage to hold gain levels, ignoring said interference;
   directing said gain stage to adjust gain levels in response to gain of said signals;
   directing said gain stage to raise gain level prior to onset of said interference;
   directing said gain stage to lower gain level prior to onset of said interference;
   directing said gain stage to raise gain levels at cessation of said interference; and
   directing said gain stage to lower gain levels at cessation of said interference.

30. The circuit of claim 29 further comprising a control stage directing, in response to said periodicity and duration information, said system to select from a group of actions to mitigate effects of said RF interference on said signals, said group of actions consisting of:
   scheduling transmissions to avoid said interference;
   changing an RF frequency of transmissions;
   changing antenna polarity of RF transmissions;
   performing waveform subtraction of said interference;
   equalizing multipath events of an RF transmission; and
   increasing forward error correction of a transmission.

* * * * *